United States Patent
Wang et al.

(10) Patent No.: US 8,049,827 B2
(45) Date of Patent: Nov. 1, 2011

(54) THIN FILM TRANSISTOR ARRAY SUBSTRATE

(75) Inventors: Wen-Chun Wang, Taichung (TW); Chin-Chang Liu, Taichung County (TW); I Fang Wang, Chang Hua (TW)

(73) Assignee: Wintek Corporation, Taichung (TW)

( * ) Notice: Subject to any disclaimer, the term of this patent is extended or adjusted under 35 U.S.C. 154(b) by 385 days.

(21) Appl. No.: 12/333,806

(22) Filed: Dec. 12, 2008

(65) Prior Publication Data

US 2009/0152564 A1 Jun. 18, 2009

(30) Foreign Application Priority Data

Dec. 14, 2007 (TW) .............................. 96147824 A

(51) Int. Cl.
*G02F 1/141* (2006.01)
*G02F 1/1343* (2006.01)

(52) U.S. Cl. ........... 349/37; 349/146; 349/143; 349/139

(58) Field of Classification Search .................. 349/146, 349/37
See application file for complete search history.

(56) References Cited

U.S. PATENT DOCUMENTS

| | | | | |
|---|---|---|---|---|
| 6,771,345 B2 * | 8/2004 | Liu et al. | ........................ | 349/146 |
| 7,663,708 B2 * | 2/2010 | Wang et al. | ..................... | 349/37 |
| 7,728,939 B2 * | 6/2010 | Tsai et al. | ..................... | 349/129 |
| 2004/0263745 A1 * | 12/2004 | Lee et al. | ..................... | 349/139 |
| 2008/0002072 A1 * | 1/2008 | Ong | ............................... | 349/37 |
| 2008/0291348 A1 * | 11/2008 | Ong | ............................... | 349/37 |

* cited by examiner

*Primary Examiner* — Wen-Ying P Chen
(74) *Attorney, Agent, or Firm* — Muncy, Geissler, Olds & Lowe, PLLC

(57) ABSTRACT

A thin film transistor array substrate includes an insulating substrate, a plurality of scan lines, an insulating layer, a plurality of data lines, and a plurality of pixels arranged in an array of rows and columns. The pixels in each row are aligned in a row direction, the pixels in each column are aligned in a column direction, and the pixels are separated from each other by the scan lines and the data lines. Each pixel includes a thin film transistor and a pixel electrode. The pixel electrode has at least one opening that extends from the periphery to the inside of the pixel electrode and at least one extension part that extends in the row direction into an opening of a neighboring pixel electrode in the same row. Each of the scan lines alternately controls one of the pixel electrodes in a first row and one of the pixel electrodes in a second row immediately adjacent to the first row.

16 Claims, 10 Drawing Sheets

THIN FILM TRANSISTOR ARRAY SUBSTRATE

CROSS REFERENCE TO RELATED APPLICATION

This application claims priority of application No. 096147824 filed in Taiwan R.O.C on Dec. 14, 2007 under 35 U.S.C. §119; the entire contents of which are hereby incorporated by reference.

FIELD OF THE INVENTION

The invention relates to a thin film transistor (TFT) array substrate.

DESCRIPTION OF THE RELATED ART

Typically, the display contrast ratio and response speed offered by a VA (vertically-aligned) mode liquid crystal display, which uses negative liquid crystal materials and vertical alignment films, are better than a TN (twisted-nematic) mode LCD, since liquid crystal molecules are aligned in a vertical direction when no voltage is applied. Also, it is known the viewing angle performance of a VA mode LCD is improved by setting the orientation directions of the liquid crystal molecules inside each picture element to a plurality of mutually different directions; that is, forming multiple distinct domains in the liquid crystal display.

FIG. 8 shows a schematic diagram illustrating a conventional design of a multi-domain vertically aligned liquid crystal display (MVA LCD). Referring to FIG. 8, a top substrate 102 and a bottom substrate 104 are both provided with protrusions 106 having different inclined surfaces and covered by vertical alignment films 108. Hence, the liquid crystal molecules 112 near the inclined surfaces orientate vertically to the inclined surfaces to have different degrees of pre-tilt angles. In case the pre-tilt liquid crystal molecules exist, surrounding liquid crystal molecules 112 are tilted in the directions of the pre-tilt liquid crystal molecules 112 when a voltage is applied. Thus, multiple domains each having individual orientation direction of liquid crystal molecules 112 are formed. Besides, the domain-regulating structure for providing inclined surfaces includes, but is not limited to, the protrusions 106, and other structure such as a concave structure 114 shown in FIG. 9 may also be used.

However, when one compares the optical path of light I1 and that of light I2 shown both in FIGS. 8 and 9, it is clearly found the tilted liquid crystal molecules through which the light I2 passes under a field-off state may result in a non-zero phase difference ($\Delta$nd≠0) to cause light leakage. Accordingly, additional compensation films must be provided to eliminate the light leakage.

FIG. 10 shows a schematic diagram illustrating another conventional design of an MVA LCD. Referring to FIG. 10, the transparent electrode 204 on the substrate 202 is provided with slits 206. Because of the fringe fields produced at edges of transparent electrode 204 and at each slit 206, the liquid crystal molecules 208 are tilted toward the center of each slit 206 to result in a multi-domain liquid crystal (LC) cell. However, the strength of the fringe fields generated by the formation of the slits 206 is often insufficient, particularly when the widths and the intervals of the slits 206 are not optimized. Besides, since the azimuth in which the liquid crystal molecules tilt due to fringe fields includes all directions of 360 degrees, a disclination region 210 often appears beyond the slits 206 or between two adjacent slits 206 to result in a reduced light transmittance.

BRIEF SUMMARY OF THE INVENTION

The invention provides a thin film transistor array substrate capable of forming a multi-domain liquid crystal cell by a simplified driving architecture and having a reduced fabrication cost.

According to an embodiment of the invention, a thin film transistor array substrate includes an insulating substrate, a plurality of scan lines formed on the insulating substrate, an insulating layer formed on the scan lines and the insulating substrate, a plurality of data lines formed on the insulating layer, and a plurality of pixels arranged in an array of rows and columns. The pixels in each row are aligned in a row direction, the pixels in each column are aligned in a column direction, and the pixels are separated from each other by the scan lines and the data lines. Each pixel includes a thin film transistor and a pixel electrode. The thin film transistor is electrically connected to at least one of the scan lines and at least one of the data lines. The pixel electrode has at least one opening that extends from the periphery to the inside of the pixel electrode and at least one extension part that extends in the row direction into an opening of a neighboring pixel electrode in the same row. Each of the scan lines alternately controls one of the pixel electrodes in a first row and one of the pixel electrodes in a second row immediately adjacent to the first row.

According to another embodiment of the invention, a thin film transistor array substrate includes an insulating substrate, a plurality of scan lines formed on the insulating substrate, an insulating layer formed on the scan lines and the insulating substrate, a plurality of data lines formed on the insulating layer, and a plurality of pixels arranged in an array of rows and columns. The pixels in each row are aligned in a row direction, the pixels in each column are aligned in a column direction, and the pixels are separated from each other by the scan lines and the data lines. Each pixel includes a thin film transistor and a pixel electrode. The thin film transistor is electrically connected to at least one of the scan lines and at least one of the data lines. The pixel electrode has at least one opening that extends from the periphery to the inside of the pixel electrode and at least one extension part that extends in the row direction into an opening of a neighboring pixel electrode in the same row. Each two thin film transistors respectively belong to two adjacent pixels in the same column are connected to different scan lines, and each two thin film transistors respectively belong to two adjacent pixels in the same row are connected to different scan lines, so that the polarity of one of the pixels is opposite to the polarity of its surrounding pixels.

Through the above embodiments, that fringed fields are produced to form a multi-domain profile of an LC cell can be easily achieved through typical TFT fabrication processes. Hence, compared with the conventional design where a protrusion or a concave structure is used to cause tilted liquid crystal molecules, the residue phase difference is eliminated to avoid light leakage according to this embodiment since all liquid crystal molecules are vertically aligned under a field-off state. Further, compared with another conventional design where slits are formed to produce fringe fields, the biased auxiliary electrode, such as the extension part of each pixel electrode, allows for stronger field strength to tilt liquid crystal molecules so as to reduce the areas of a disclination region and thus increase the light-transmittance of an LCD. Further, under the above design where the extension part of a pixel electrode extends in the row direction to the inside of its neighboring pixel electrode in the same row to produce fringe fields, each pixel electrode or electrode section must have a polarity opposite to the polarity of its surrounding pixel electrodes or electrode sections, and such requirement is typically met by the use of a dot inversion drive scheme. However, when each scan line is alternately connected to a TFT of a first pixel above the scan line and connected to a TFT of a second pixel below the scan line, a line inversion drive scheme may achieve the same effect as a dot inversion drive scheme may do. Hence, since the line inversion drive scheme has lower power consumption and simplified driving architecture compared with the dot inversion drive scheme, the fabrication cost and power consumption are both reduced. In addition, since only a lateral extension part of a pixel electrode is used as a biased electrode to produce fringe fields, a multi-domain profile of an LC cell is obtained without apparently decreasing the aperture ratio.

Other objectives, features and advantages of the present invention will be further understood from the further technological features disclosed by the embodiments of the present invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and variations thereof herein are used broadly and encompass direct and indirect connections, couplings, and mountings. Similarly, "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
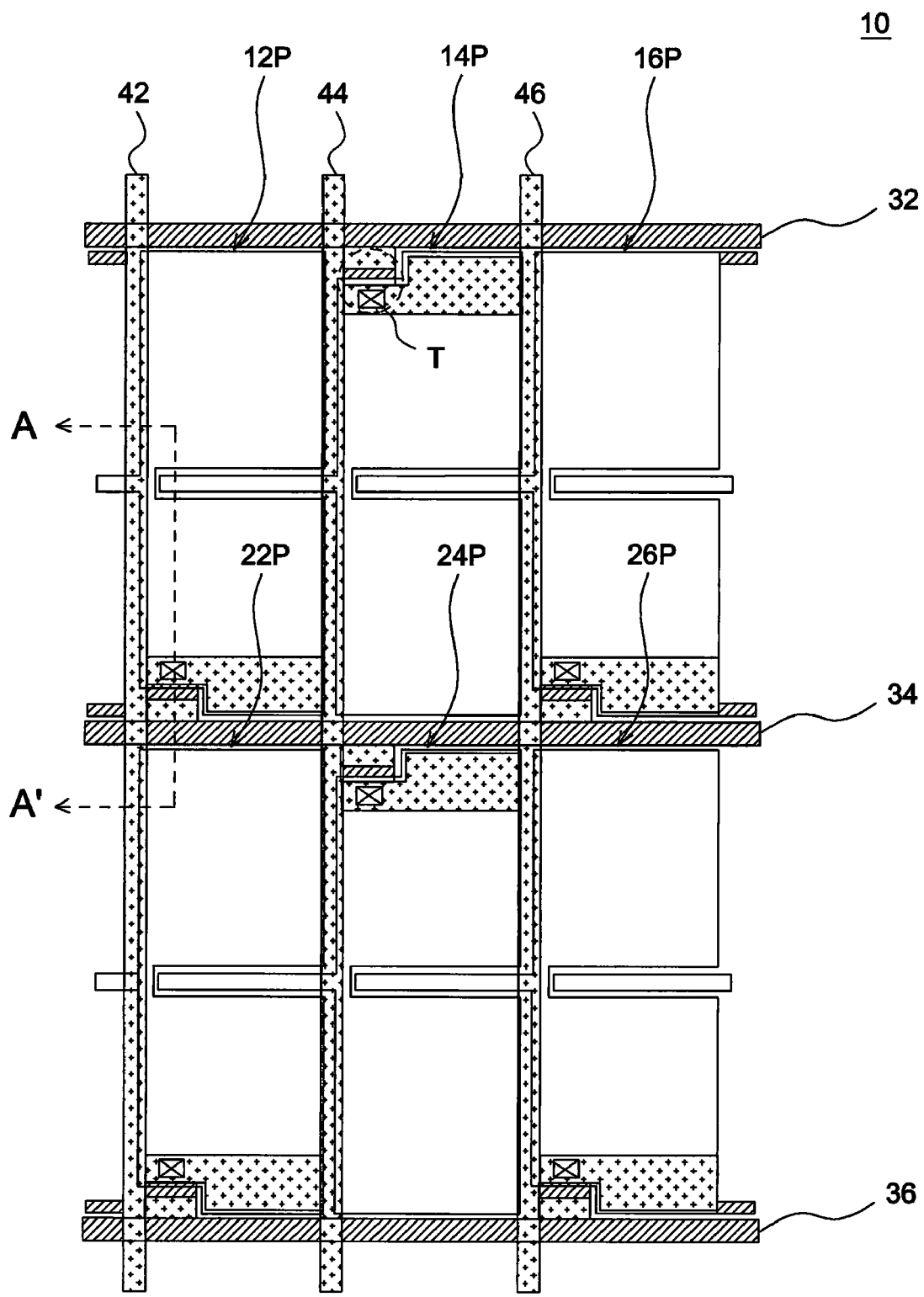
FIG. 1 shows a plan view of a thin film transistor array substrate according to an embodiment of the invention.

FIG. 1 shows a plan view of a thin film transistor (TFT) array substrate 10 according to an embodiment of the invention. Referring to FIG. 1, on an insulating substrate (not shown) a plurality of scan lines 32, 34 and 36 are arranged in a first direction, and a plurality of data lines 42, 44 and 46 are arranged in a second direction perpendicular to the first direction, with each two scan lines intersected with each two data lines to define a block area on which a pixel is spread. An active device such as a thin film transistor T is provided on each intersection and electrically connected to the scan line and the data line. A plurality of pixels 12P, 14P, 16P, 22P, 24P and 26P are arranged regularly on the insulating substrate to define an array of rows and columns, where the pixels in each row are aligned in a row direction (such as a horizontal direction) and the pixels in each column are aligned in a column direction (such as a vertical direction).

Figure 2:
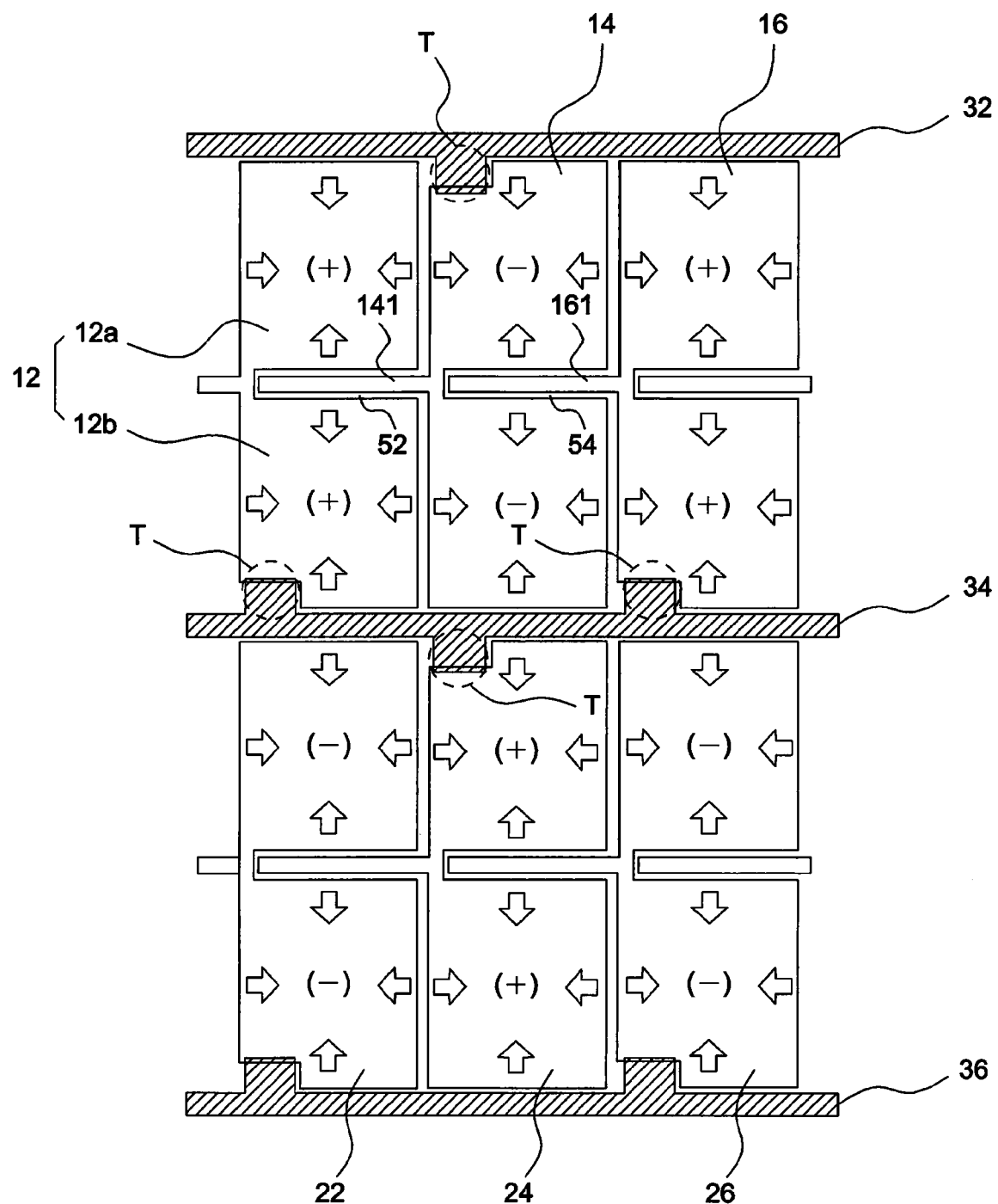
FIG. 2 shows a simplified schematic diagram of FIG. 1.

FIG. 2 shows a simplified schematic diagram of FIG. 1 for illustrating a layout of pixel electrodes and a polarity pattern for the TFT array substrate. Referring to FIG. 2, each pixel electrode 12, 14 or 16 has an opening that extends from its periphery to its inside to divide each pixel electrode into two sections. Taking the pixel electrode 12 as an example, an opening 52 is formed in its center portion to divide the pixel electrode 12 into two sections 12a and 12b. Further, each pixel electrode has an extension part that extends in the row direction (such as the horizontal direction) into an opening of a neighboring pixel electrode in the same row. For example, an extension part 141 of the pixel electrode 14 extends into an opening 52 of its neighboring pixel electrode 12, and an extension part 161 of the pixel electrode 16 extends into an opening 54 of its neighboring pixel electrode 14. Further, according to this embodiment, each thin film transistor T is alternately provided on the top side and the bottom side of a row of pixels, and each scan line does not control all pixel electrodes in the same row but alternately control first pixel electrodes above the scan line and second pixel electrodes below the scan line, with the first and the second pixel electrodes respectively belonging to two adjacent rows. In one embodiment, the gate of a thin film transistor T is connected to a corresponding scan line, its source is connected to a corresponding data line, and its drain is connected to a liquid crystal capacitor Clc and a storage capacitor Cs (not shown). When a scan signal is fed to the gate of the thin film transistor T to turn it on, the data voltage transmitted by the data line is applied to the liquid crystal capacitor Clc and the storage capacitor Cs via the drain of the thin film transistor T. Taking the scan line 34 as an example, the scan line 34 is connected to a top pixel electrode 12, a bottom pixel electrode 24, and a top pixel electrode 16 in succession via thin film transistors T, so that the pixel electrodes 12, 24 and 16 are allowed to have the same polarity. Hence, when the pixels are driven by a line inversion drive scheme, each of the scan lines 32, 34 and 36 may alternately control its top pixel electrodes and its bottom pixel electrodes, so that each pixel electrode is allowed to have a polarity opposite to the polarity of its surrounding pixel electrodes or electrode sections. For example, the electrode section 12b is allowed to have a positive polarity opposite to the negative polarity of an extension part 141 of its top pixel electrode, its right side pixel electrode 14, and its bottom pixel electrode 22 to produce fringe fields, and thus a multi-domain profile is formed in each pixel electrode section.

According to the above embodiment, that fringed fields are produced to form a multi-domain profile of an LC cell can be easily achieved through typical TFT fabrication processes. Hence, compared with the conventional design where a protrusion or a concave structure is used to cause tilted liquid crystal molecules, the residue phase difference is eliminated to avoid light leakage according to this embodiment since all liquid crystal molecules are vertically aligned under a field-off state. Further, compared with another conventional design where slits are formed to produce fringe fields, the biased auxiliary electrode, such as the extension part of each pixel electrode in one embodiment, allows for stronger field strength to tilt liquid crystal molecules so as to reduce the areas of a disclination region and thus increase the light-transmittance of an LCD. Further, under the above design where the extension part of a pixel electrode extends in the row direction (such as the horizontal direction) to the inside of its neighboring pixel electrode in the same row to produce fringe fields, each pixel electrode or electrode section must have a polarity opposite to the polarity of its surrounding pixel electrodes or electrode sections, and such requirement is typically met by the use of a dot inversion drive scheme. However, when each scan line is alternately connected to a TFT of a first pixel above the scan line and connected to a TFT of a second pixel below the scan line, as illustrated in FIG. 1, a line inversion drive scheme may achieve the same effect as a dot inversion drive scheme may do. Hence, since the line inversion drive scheme has lower power consumption and simplified driving architecture compared with the dot inversion drive scheme, the fabrication cost and power consumption are both reduced. In addition, since only a lateral extension part of a pixel electrode is used as a biased electrode to produce fringe fields, a multi-domain profile of an LC cell is obtained without apparently decreasing the aperture ratio.

Figure 3:
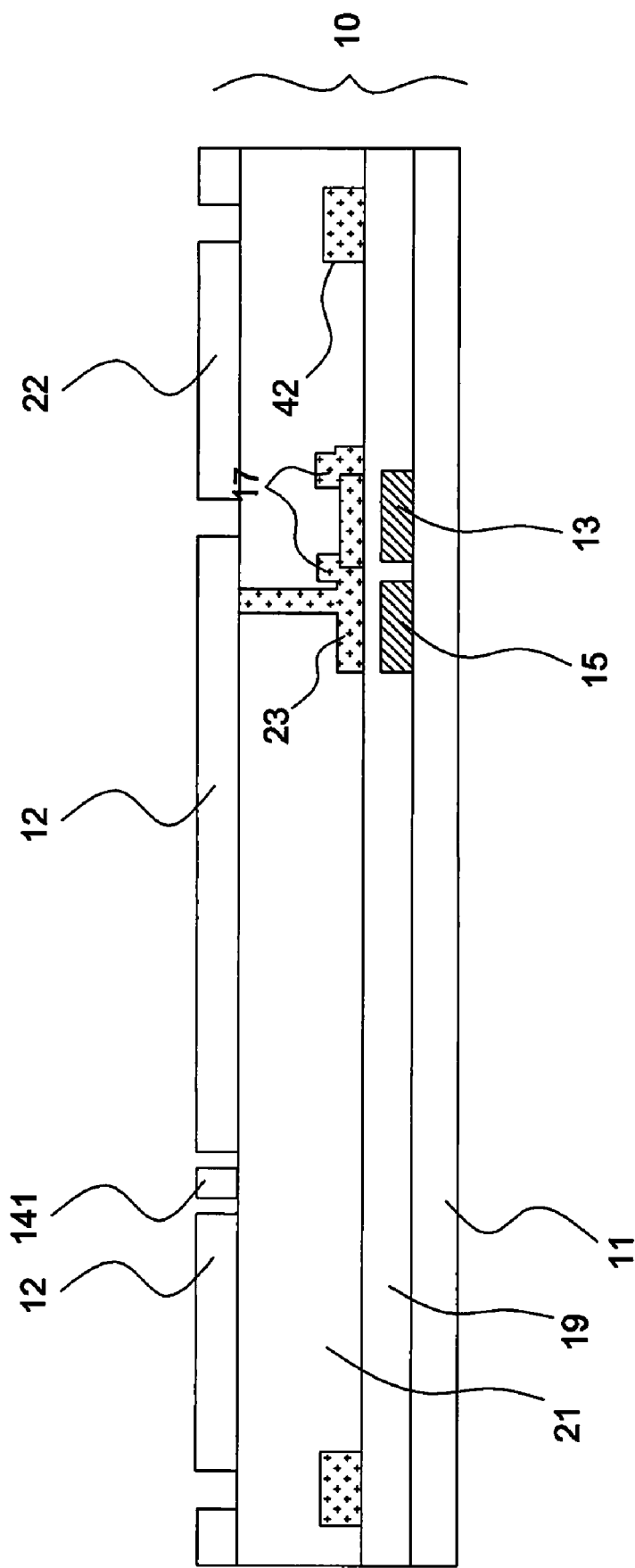
FIG. 3 shows a cross-section cut along line A-A' of FIG. 1.

FIG. 3 shows a cross-section cut along line A-A' of FIG. 1. Referring to FIG. 3, a first metal layer M1 is deposited on the insulating substrate 11 and patterned to define scan lines (not shown), gate regions 13 of TFTs, and lower capacitor electrodes 15. A dielectric insulating layer 19 is formed on the insulating substrate 11 and covers the first metal layer M1. A second metal layer M2 is deposited on the insulating layer 19 and patterned to define data lines 42, source/drain regions 17 of TFTs, and upper capacitor electrodes 23. A flattened layer 21 is formed on the insulating layer 19 and covers the source/drain regions 17 and the upper capacitor electrodes 23. A transparent conductive film is deposited on the flattened layer 21 and patterned to define pixel electrodes, and, as shown in FIG. 3, an extension part 141 of a pixel electrode 14 extends into the opening formed in its neighboring pixel electrode 12.

Figure 4:
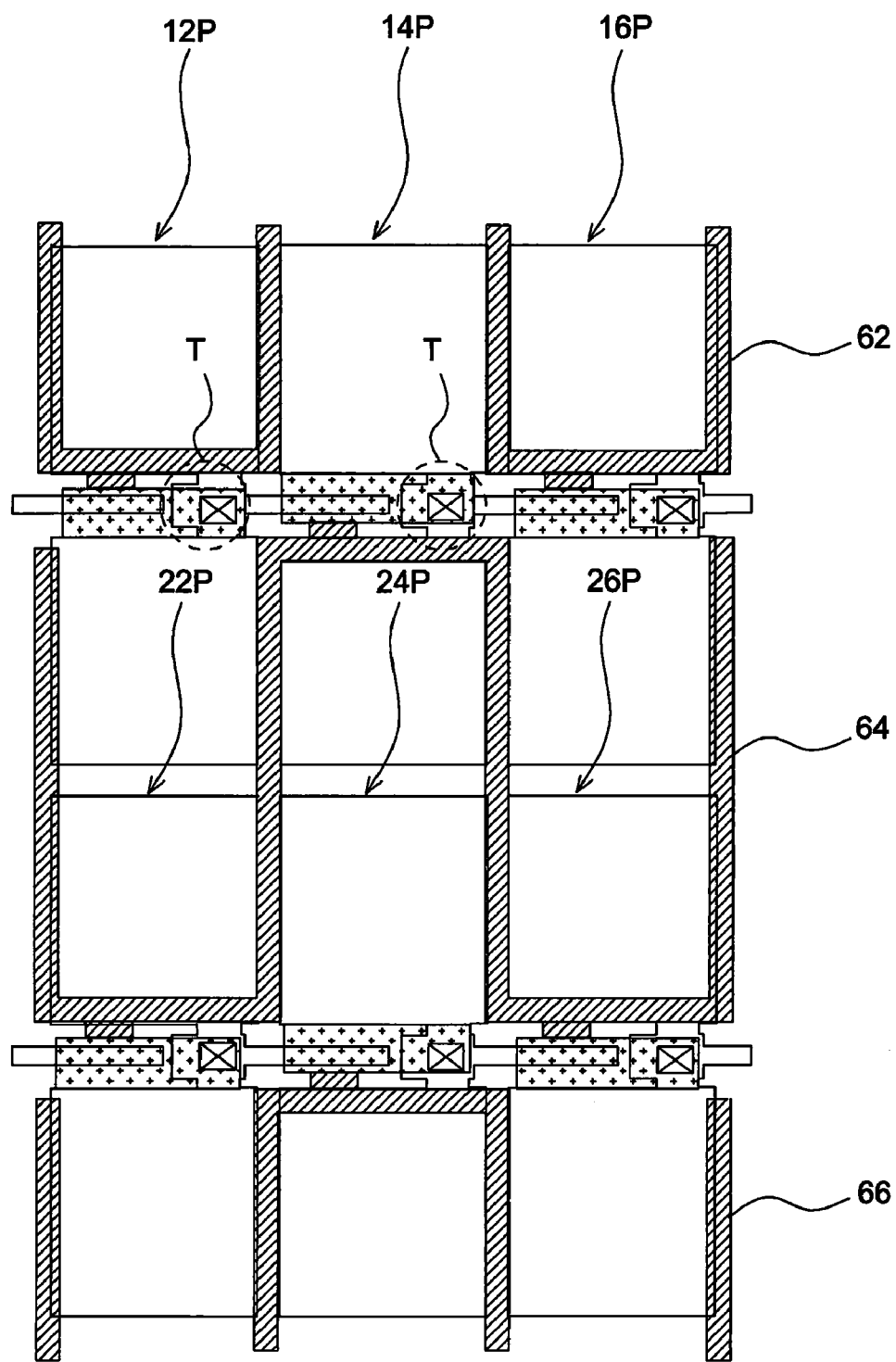
FIG. 4 shows a plan view of a TFT array substrate according to another embodiment of the invention.
Figure 5:
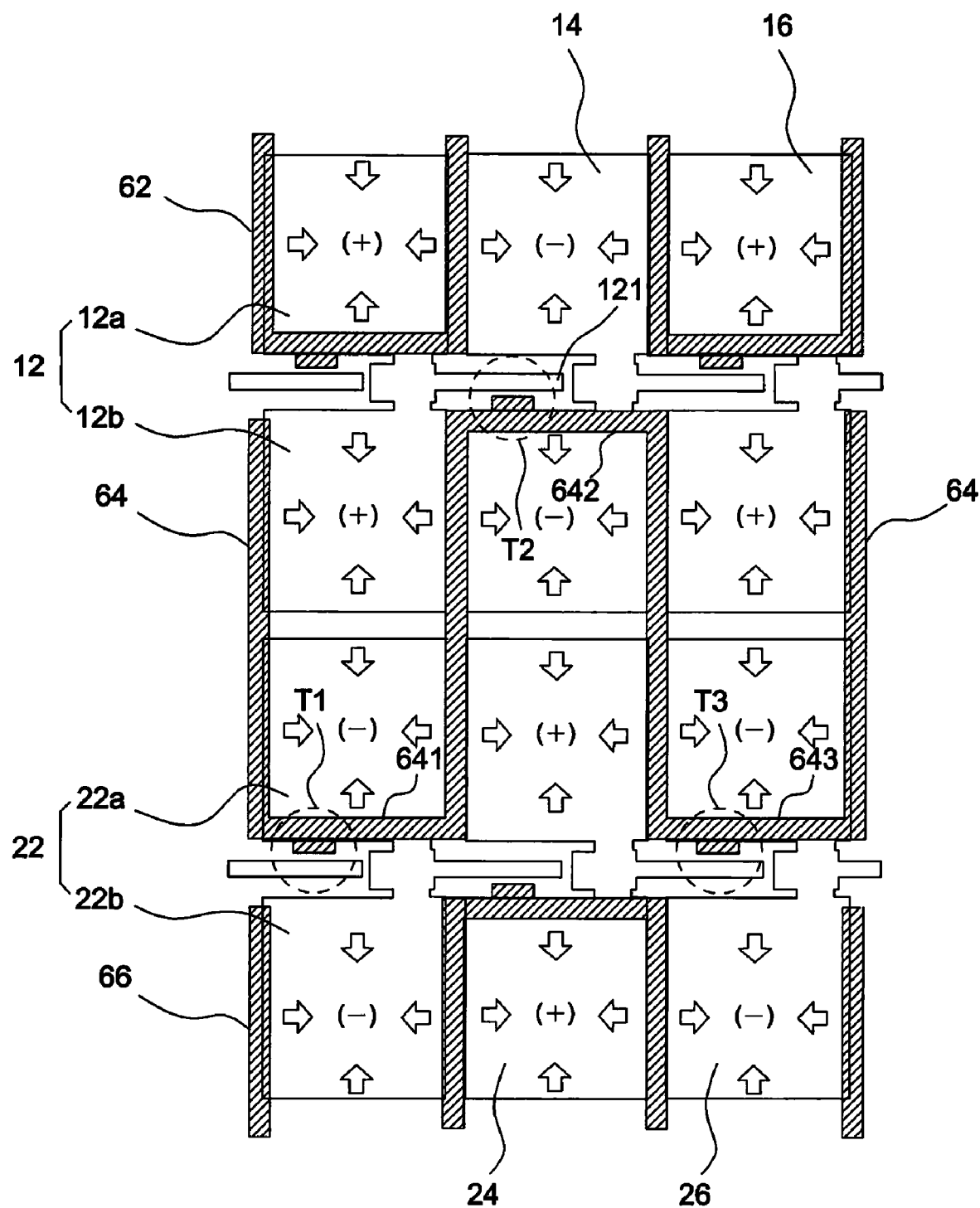
FIG. 5 shows a simplified schematic diagram of FIG. 4.

FIG. 4 shows a plan view of a TFT array substrate according to another embodiment of the invention. FIG. 5 shows a simplified schematic diagram of FIG. 4 for illustrating a layout of pixel electrodes and a polarity pattern for the TFT array substrate. Referring to both FIG. 4 and FIG. 5, in the same row of pixels, the forming positions of different thin film transistors within their respective pixels are the same, and the distribution area of each thin film transistor overlaps an opening formed in the center portion of each pixel electrode. Further, each scan line has multiple horizontal and vertical sections, and each horizontal section and each vertical section alternate with each other and surround the sections of each pixel electrode. Besides, each scan line is alternately connected to a thin film transistor of a first pixel that is above the scan line and connected to a second thin film transistor of a second pixel that is below the scan line. As shown in FIG. 5, taking scan line 64 as an example, the scan line 64 first downwards extends from the left side of an electrode section 12b to the bottom-left side of an electrode section 22a and then rightwards extends a distance of the width of a pixel to the bottom-right side of the electrode section 22a. Next, the scan line 64 upwards extends to the top-right side of the electrode section 12b, rightwards extends a distance of the width of a pixel, and then continually extends following the above rule to surround electrode sections. More specifically, in this embodiment, each unit area to be surrounded by a scan line is bounded by two thin film transistors respectively belonging to two adjacent pixels in the same column; in other words, each unit area includes a bottom electrode section of a top pixel and a top electrode section of a bottom pixel in the same column, and the scan line extends into the inside of each pixel electrode to surround each unit area. Under a line inversion drive scheme, the horizontal sections 641, 642 and 643 of a scan line 64 are connected to pixel electrodes 22, 14 and 26 via thin film transistors T1, T2 and T3, respectively, to enable the pixel electrodes 22, 14 and 26 to have a first polarity such as a negative polarity. In comparison, a scan line 62 that follows the same rule to surround each unit area is connected to the pixel electrodes 12 and 16, and, similarly, a scan line 66 is connected to the pixel electrode 24, so the pixel electrodes 12, 16 and 24 are allowed to have another polarity such as a positive polarity. According to the embodiment, since each scan line surrounds each unit area and is alternately connected to a thin film transistor of a top pixel and a thin film transistor of a bottom pixel, each electrode section of a pixel electrode is allowed to have a polarity opposite to the polarity of its surrounding electrode sections or extension parts under a line inversion drive scheme. Hence, since the line inversion drive scheme has lower power consumption and simplified driving architecture compared with the dot inversion drive scheme, the fabrication cost and power consumption are both reduced. In addition, in this embodiment each extension part of a pixel electrode that is used as a biased electrode to produce fringe fields overlaps a signal control region on which a thin film transistor is provided, thus further improving the aperture ratio.

Figure 6:
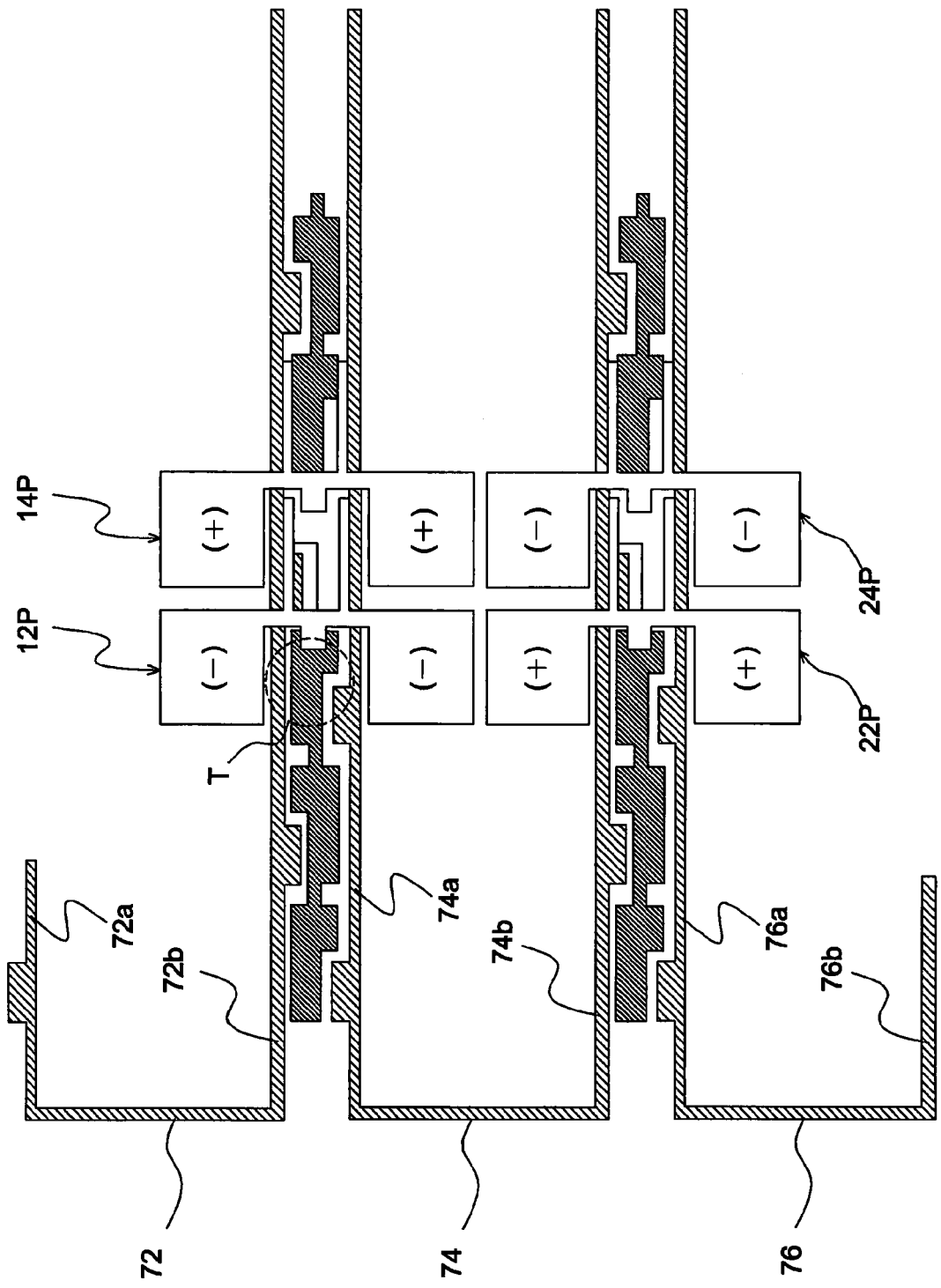
FIG. 6 shows a plan view of a TFT array substrate according to another embodiment of the invention.
Figure 7:
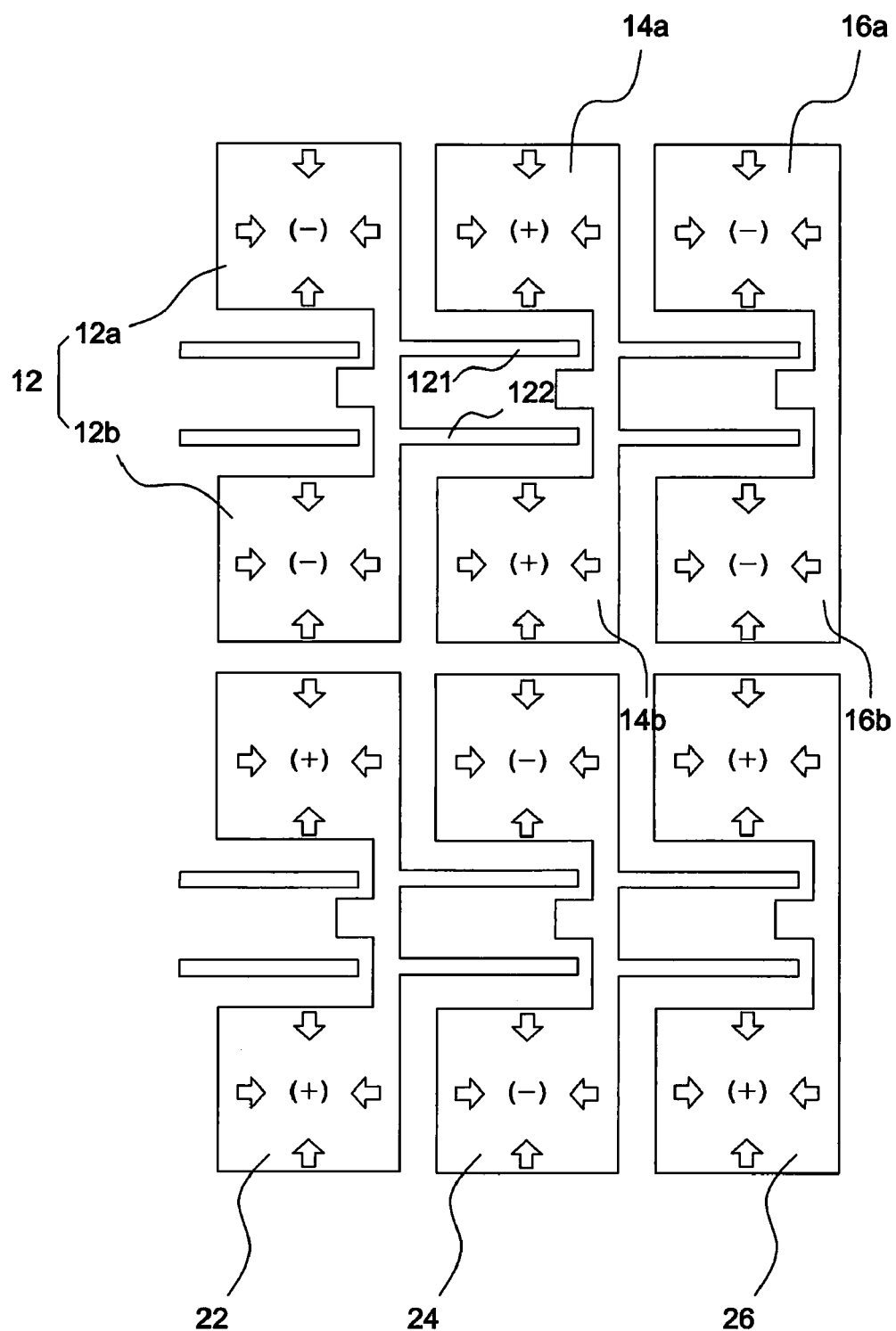
FIG. 7 shows a simplified schematic diagram of FIG. 6.
Figure 8:
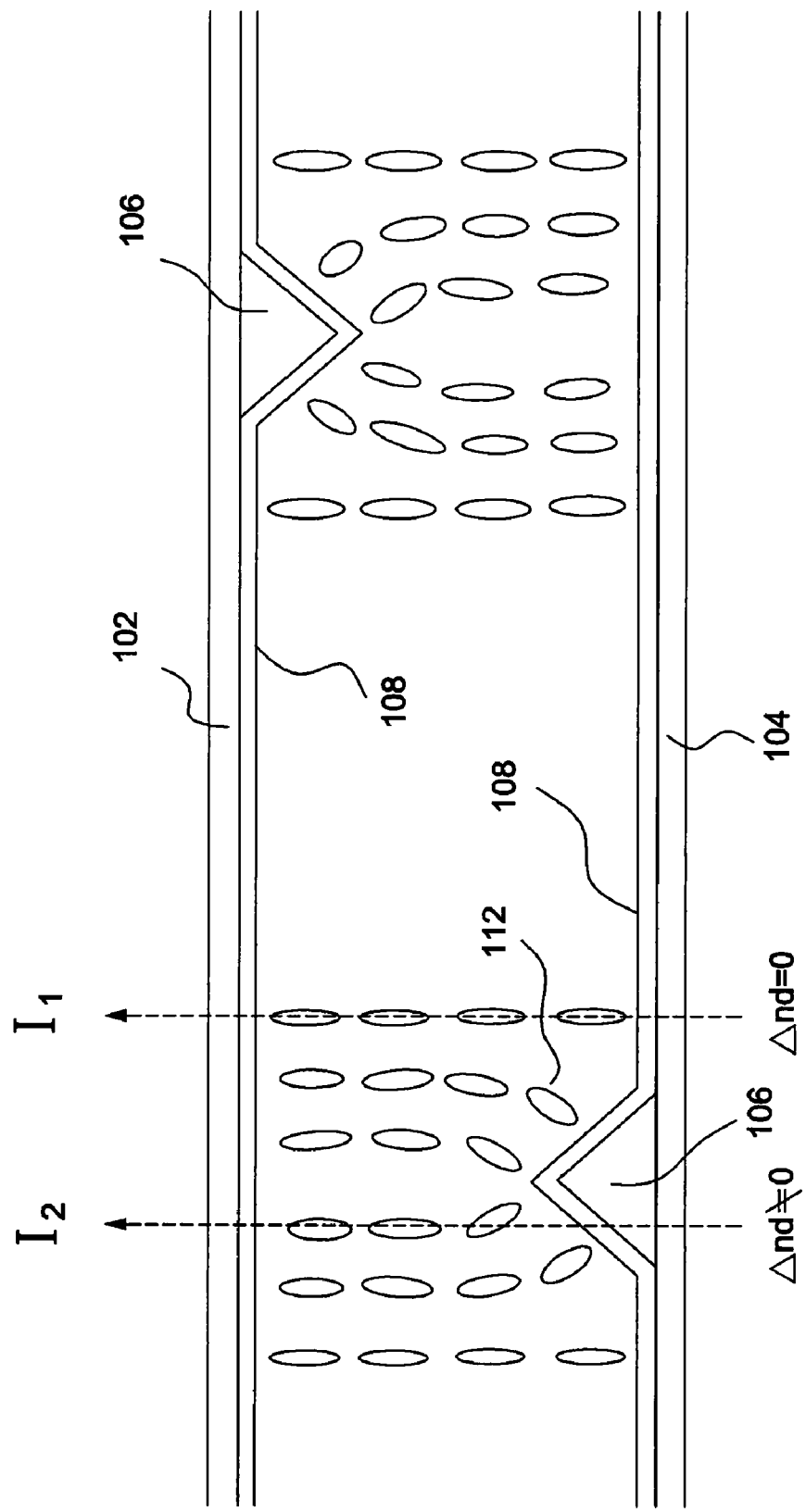
FIG. 8 shows a schematic diagram illustrating a conventional design of a multi-domain vertically aligned liquid crystal display.
Figure 9:
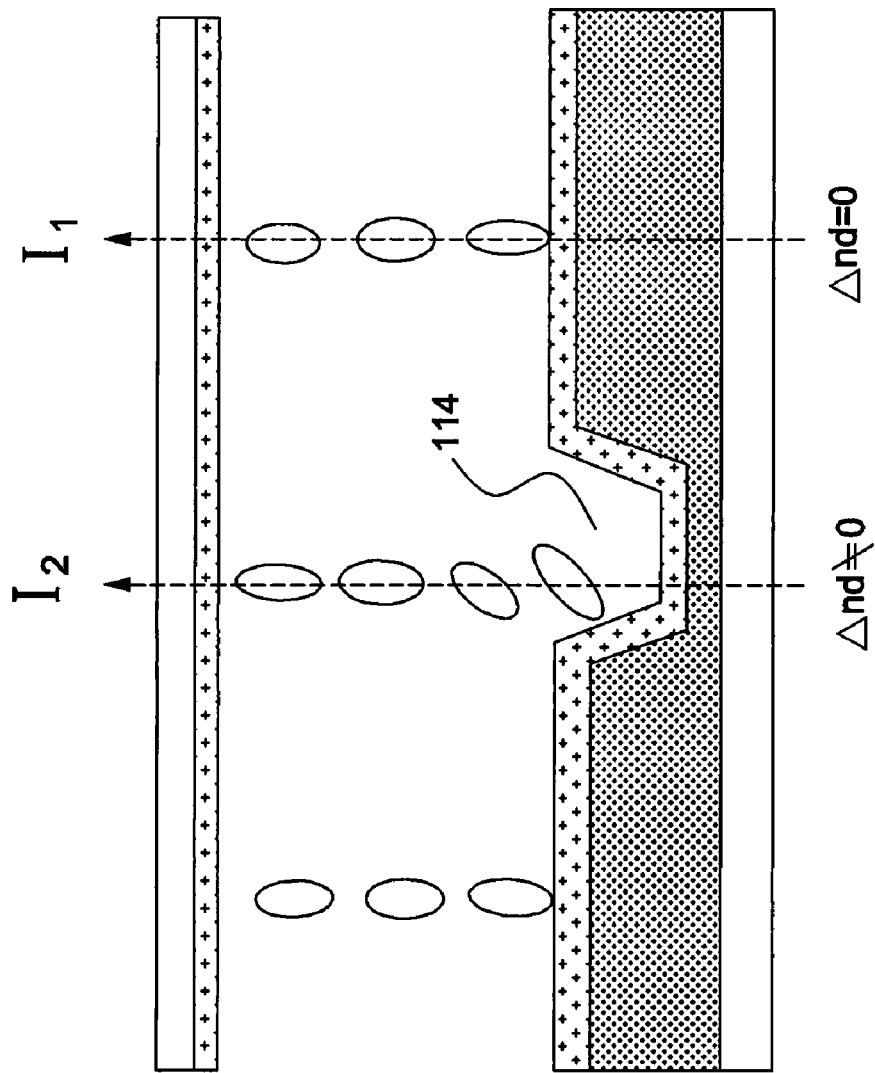
FIG. 9 shows a schematic diagram illustrating another multi-domain vertically aligned liquid crystal display.
Figure 10:
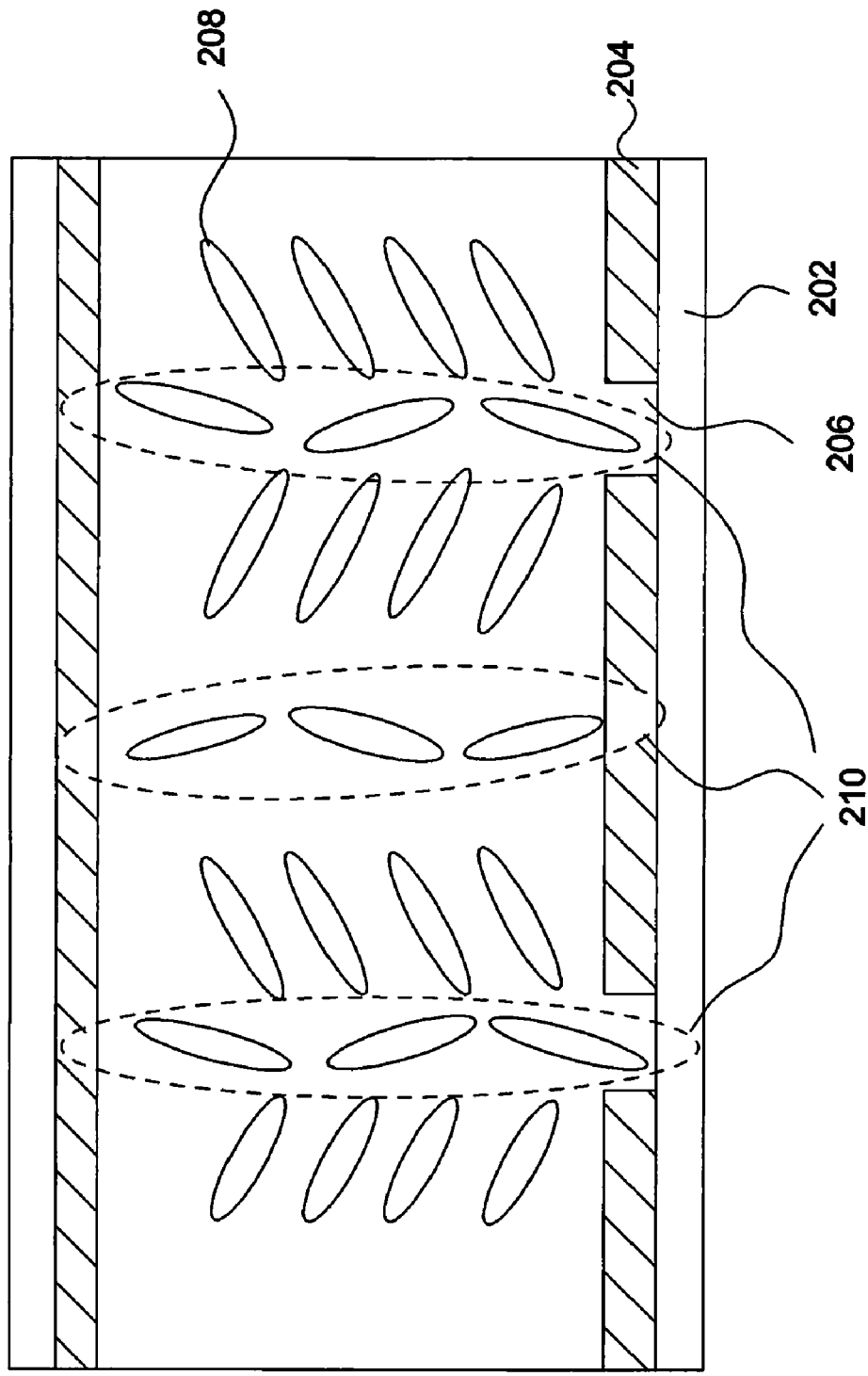
FIG. 10 shows a schematic diagram illustrating another multi-domain vertically aligned liquid crystal display.

FIG. 6 shows a plan view of a TFT array substrate according to another embodiment of the invention. FIG. 7 shows a simplified schematic diagram of FIG. 6 for illustrating a layout of pixel electrodes and a polarity pattern for the TFT array substrate. Referring to FIG. 6, in this embodiment, a first section and a second section of scan lines are located in a signal control region (a center non-active display region on which a TFT is provided) of a pixel, and the first section and the second section respectively belong to two adjacent scan lines. For example, a section 72b of a scan line 72 and a section 74a of a scan line 74 extend across the signal control regions of pixels 12P and 14P in the same row, the section 72b is connected to the thin film transistor of the pixel 14P, and the section 74a is connected to the thin film transistor of the pixel 12P. Similarly, a section 74b of a scan line 74 and a section 76a of a scan line 76 extend across the signal control regions of pixels 22P and 24P in the same row, the section 74b is connected to the thin film transistor of the pixel 24P, and the section 76a is connected to the thin film transistor of the pixel 22P. In this embodiment, each scan line includes two different sections respectively in two adjacent rows of pixels, where a first section (such as section 74a) in a top row of pixels is below the signal control regions and a second section (such as section 74b) in a bottom row of pixels is above the signal control regions, and the two sections may be connected within or outside an active display region.

In this embodiment, under a line inversion drive scheme the pixel electrodes controlled by a first scan line have a polarity opposite to the polarity of pixel electrodes controlled by a second line that is adjacent to the first scan line. For example, in case the pixel electrodes controlled by the scan line 72 have a positive polarity, the pixel electrodes controlled by the scan line 74 have a negative polarity, and the pixel electrodes controlled by the scan line 76 have a positive polarity. Through the above arrangement of scan lines and pixel electrodes shown in FIG. 6, the pixel 12P is allowed to have a negative polarity, the pixel 14P is allowed to have a positive polarity, the pixel 22P is allowed to have a positive polarity, and the pixel 24P is allowed to have a negative polarity. Further, as shown in FIG. 7, in this embodiment each pixel electrode has an opening that extends from its periphery to its inside to divide the pixel electrode into two sections. Besides, each pixel electrode has two lateral extension parts 121 and 122 that extend in the row direction (such as the horizontal direction) into an opening of its neighboring pixel electrode in the same row and are respectively adjacent to a top electrode section and a bottom electrode section. Hence, an extension part 121 with a negative polarity of a pixel electrode 12, an electrode section 12a with a negative polarity, and an electrode section 16a with a negative polarity may together surround an electrode section 14a with a positive polarity. In that case, each pixel electrode or electrode section may have a polarity opposite to the polarity of its surrounding extension parts or electrode sections under a line inversion drive scheme. Hence, since the line inversion drive scheme has lower power consumption and simplified driving architecture compared with the dot inversion drive scheme, the fabrication cost and power consumption are both reduced. In addition, in this embodiment each extension part of a pixel electrode that is used as a biased electrode to produce fringe fields overlaps a signal control region on which a thin film transistor is provided, thus further improving the aperture ratio.

Note that, in all the above embodiments, each pixel electrode is exemplified as dividing into two sections; however, this is not limited and each pixel electrode can be arbitrary divided according to the actual demand.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the elements or component is explicitly recited in the following claims.

What is claimed is:

1. A thin film transistor array substrate, comprising:
an insulating substrate;
a plurality of scan lines formed on the insulating substrate;
an insulating layer formed on the scan lines and the insulating substrate;
a plurality of data lines formed on the insulating layer; and
a plurality of pixels arranged in an array of rows and columns, wherein the pixels in each row are aligned in a row direction, the pixels in each column are aligned in a column direction, and the pixels are separated from each other by the scan lines and the data lines, and each pixel comprising:
a thin film transistor electrically connected to at least one of the scan lines and at least one of the data lines; and
a pixel electrode having at least one opening that extends from the periphery to the inside of the pixel electrode and having at least one extension part that extends in the row direction into an opening of a neighboring pixel electrode in the same row, wherein each of the scan lines alternately controls one of the pixel electrodes in a first row and one of the pixel electrodes in a second row immediately adjacent to the first row, and the opening is formed in the middle of the pixel electrode and the thin film transistor is formed near one side of the pixel electrode.

2. The thin film transistor array substrate as claimed in claim 1, wherein each of the scan lines extends in the row direction and is alternately connected to a thin film transistor of a first pixel above the scan line and connected to a thin film transistor of a second pixel below the scan line.

3. The thin film transistor array substrate as claimed in claim 1, wherein the forming position of a thin film transistor within a first pixel is different to the forming position of a thin film transistor within an adjacent second pixel in the same row.

4. A thin film transistor array substrate, comprising:
an insulating substrate;
a plurality of scan lines formed on the insulating substrate;
an insulating layer formed on the scan lines and the insulating substrate;
a plurality of data lines formed on the insulating layer; and
a plurality of pixels arranged in an array of rows and columns, wherein the pixels in each row are aligned in a row direction, the pixels in each column are aligned in a column direction, and the pixels are separated from each other by the scan lines and the data lines, and each pixel comprising:

a thin film transistor electrically connected to at least one of the scan lines and at least one of the data lines; and a pixel electrode having at least one opening that extends from the periphery to the inside of the pixel electrode and having at-least one extension part that extends in the row direction into an opening of a neighboring pixel electrode in the same row, wherein each of the scan lines alternately controls one of the pixel electrodes in a first row and one of the pixel electrodes in a second row immediately adjacent to the first row wherein the distribution area of each thin film transistor overlaps the opening of the pixel electrode.

5. The thin film transistor array substrate as claimed in claim 4, wherein each of the scan lines comprises first sections extending in the row direction and second sections extending in the column direction, with each first section and each second section alternating with each other.

6. The thin film transistor array substrate as claimed in claim 5, wherein each of the scan lines is alternately connected to a thin film transistor of a first pixel above the scan line and connected to a thin film transistor of a second pixel below the scan line by the first sections.

7. The thin film transistor array substrate as claimed in claim 4, wherein the forming position of a thin film transistor within a first pixel is identical to the forming position of a thin film transistor within an adjacent second pixel in the same row.

8. The thin film transistor array substrate as claimed in claim 4, wherein each of the scan lines surrounds a unit area that is bounded by two thin film transistors respectively belonging to two adjacent pixels in the same column.

9. The thin film transistor array substrate as claimed in claim 8, wherein the pixel electrode is divided by the opening into a top electrode section and a bottom electrode section, and the unit area surrounded by the scan line comprises a top electrode section of a first pixel electrode and a bottom electrode section of a second pixel electrode that is adjacent to the first pixel electrode.

10. The thin film transistor array substrate as claimed in claim 4, wherein each of the pixels has a signal control region and a section of a first scan line and a section of a second scan line that is adjacent to the first scan line are both located in the signal control region.

11. The thin film transistor array substrate as claimed in claim 4, wherein each of the scan lines has a first section extending across a first row of pixels and a second section extending across a second row of pixels adjacent to the first row of pixels.

12. The thin film transistor array substrate as claimed in claim 11, wherein the first section is connected to the odd-numbered thin film transistors of the first row of pixels and the second section is connected to the even-numbered thin film transistors of the second row of pixels.

13. A thin film transistor array substrate, comprising:
an insulating substrate;
a plurality of scan lines formed on the insulating substrate;
an insulating layer formed on the scan lines and the insulating substrate;
a plurality of data lines formed on the insulating layer; and
a plurality of pixels arranged in an array of rows and columns, wherein the pixels in each row are aligned in a row direction, the pixels in each column are aligned in a column direction, and the pixels are separated from each other by the scan lines and the data lines, and each pixel comprising:

a thin film transistor electrically connected to at least one of the scan lines and at least one of the data lines; and a pixel electrode having at least one opening that extends from the periphery to the inside of the pixel electrode and having at least one extension part that extends in the row direction into an opening of a neighboring pixel electrode in the same row, and the distribution area of each thin film transistor overlapping the opening of the pixel electrode, wherein each two thin film transistors respectively belong to two adjacent pixels in the same column are connected to different scan lines, and each two thin film transistors respectively belong to two adjacent pixels in the same row are connected to different scan lines, so that the polarity of one of the pixels is opposite to the polarity of its surrounding pixels.

14. The thin film transistor array substrate as claimed in claim 13, wherein each of the scan lines comprises first sections extending in the row direction and second sections extending in the column direction, with each first section and each second section alternating with each other, and each of the scan lines is alternately connected to a thin film transistor of a first pixel above the scan line and connected to a thin film transistor of a second pixel below the scan line by the first sections.

15. The thin film transistor array substrate as claimed in claim 13, wherein each of the scan lines surrounds a unit area that is bounded by two thin film transistors respectively belonging to two adjacent pixels in the same column, each pixel electrode is divided by the opening into a top electrode section and a bottom electrode section, and the unit area comprises a top electrode section of a first pixel electrode and a bottom electrode section of a second pixel electrode that is adjacent to the first pixel electrode.

16. The thin film transistor array substrate as claimed in claim 13, wherein the pixel electrode is divided by the opening into a first electrode section and a second electrode section, and the pixel electrode has a first and a second extension parts that are respectively adjacent to the first and the second electrode sections and extend in the row direction.

\* \* \* \* \*